United States Patent
Mao et al.

(10) Patent No.: US 7,057,865 B1
(45) Date of Patent: Jun. 6, 2006

(54) HIGH SENSITIVITY TUNNELING GMR SENSORS WITH SYNTHETIC ANTIFERROMAGNET FREE LAYER

(75) Inventors: Sining Mao, Savage, MN (US); Janusz J. Nowak, Edina, MN (US); Eric S. Linville, St. Paul, MN (US); Jian Chen, Shakopee, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 440 days.

(21) Appl. No.: 09/925,850

(22) Filed: Aug. 9, 2001

Related U.S. Application Data

(60) Provisional application No. 60/224,182, filed on Aug. 9, 2000.

(51) Int. Cl.
*G11B 5/39* (2006.01)

(52) U.S. Cl. .................................................. 360/324.2

(58) Field of Classification Search ............. 360/324.1, 360/324.11, 324.12, 324.2
See application file for complete search history.

(56) References Cited

U.S. PATENT DOCUMENTS

| | | | |
|---|---|---|---|
| 5,966,012 A * | 10/1999 | Parkin | 324/252 |
| 5,966,275 A | 10/1999 | Iijima | |
| 5,966,323 A * | 10/1999 | Chen et al. | 365/158 |
| 6,023,395 A * | 2/2000 | Dill et al. | 360/324.2 |
| 6,134,090 A | 10/2000 | Mao et al. | |
| 6,153,320 A * | 11/2000 | Parkin | 428/811.2 |
| 6,166,948 A * | 12/2000 | Parkin et al. | 365/173 |
| 6,259,586 B1 * | 7/2001 | Gill | 360/324.2 |
| 6,275,363 B1 * | 8/2001 | Gill | 360/324.2 |
| 6,292,389 B1 * | 9/2001 | Chen et al. | 365/158 |
| 6,341,053 B1 * | 1/2002 | Nakada et al. | 360/324.2 |
| 6,469,879 B1 * | 10/2002 | Redon et al. | 360/324.2 |
| 6,473,275 B1 * | 10/2002 | Gill | 360/314 |
| 6,483,675 B1 * | 11/2002 | Araki et al. | 360/324.2 |
| 6,538,859 B1 * | 3/2003 | Gill | 360/324.12 |

OTHER PUBLICATIONS

Mathon, "Tight-binding theory of tunneling giant magnetoresistance," *Physical Review B*, 1997, 56(18):810-819.

Mathon and Umerski, "Theory of tunneling magnetoresistance in a junction with a nonmagnetic metallic interlayer," *Physical Review B*, 1999, 60(2):1117-1121.

* cited by examiner

Primary Examiner—Angel Castro

(57) ABSTRACT

A magnetic sensor including a tunneling magnetoresistive stack with a synthetic antiferromagnet (SAF) free layer.

20 Claims, 7 Drawing Sheets

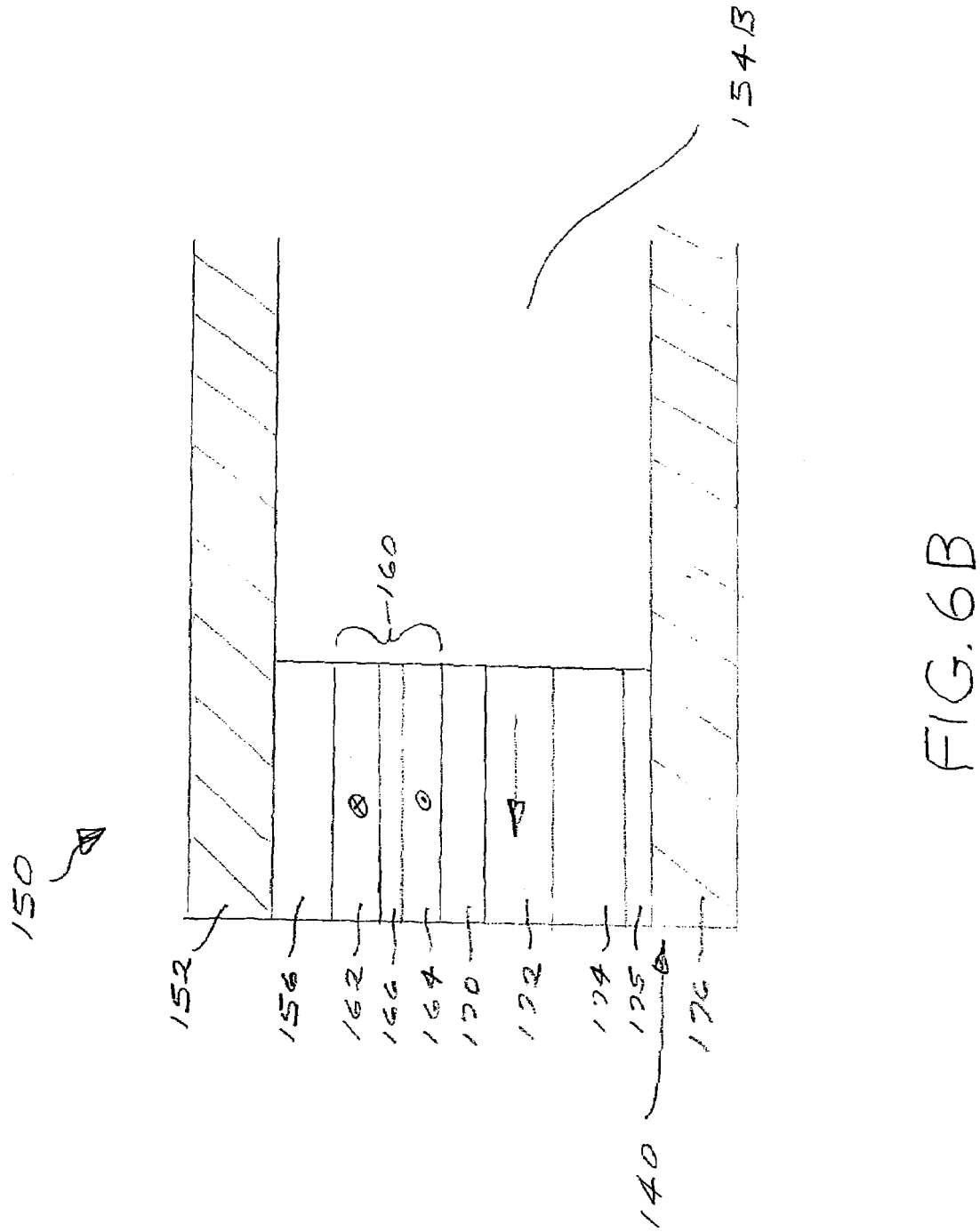

HIGH SENSITIVITY TUNNELING GMR SENSORS WITH SYNTHETIC ANTIFERROMAGNET FREE LAYER

CROSS-REFERENCE TO RELATED APPLICATION(S)

This application claims the benefit of the filing date of U.S. Provisional Application Ser. No. 60/224,182 entitled TGMR HEAD WITH SAF FREE LAYER TO IMPROVE SENSITIVITY," which was filed Aug. 9, 2000.

TECHNICAL FIELD

This invention relates to magnetoresistive sensors, and more particularly to a current perpendicular to plane (CPP) tunneling magnetoresistive read/write head with a synthetic antiferromagnetic free layer.

BACKGROUND

Referring to FIGS. 1–2, an embodiment of a disc drive system 1 is shown that includes a disc drive unit 2, an actuator assembly 4 and a controller 6. The drive unit 2 includes a hard disc 8 and a shaft 10 connected to a drive motor 20. An actuator 12 receives input from the controller 6 to position a read/write head assembly 14 over the surface of the disc 8. A read/write head in the read/write head assembly 14 receives a sensing or bias current I from a current source 22. Variations in magnetization of the disc 8 cause changes in a magnetic field detected by the head assembly 14, which in turn results in a change in the electrical resistance of the read write head. This change in electrical resistance is detected with a readback circuit 24 that provides a data output 26. Referring to FIG. 3, the read/write head assembly 14 typically includes a slider 26 that flies above a surface of the disc 8. A read/write head 100 is located at or near the edge of the slider 26.

FIG. 4 is a cross-sectional view of a magnetic read/write head 100 and disc 8 taken along a plane normal to an air bearing surface 104 of the head 100. The air-bearing surface of the read/write head 100 faces a surface 106 of the disc 8, which travels or rotates in a direction relating to the head 100 as indicated by the arrow A. A write portion of the read/write head 100 includes a top pole 108 and a top shield 114, as well as multiple layers of conductive coils 112 that are held in place by an insulator layer 110. A read portion of the read/write head 100 includes the top shield 114, a top gap layer 115, a metal contact layer 116 a bottom gap layer 117, a bottom shield 118, and a giant magnetoresistive (GMR) stack 120. The top shield 114 functions both as a shield and as a shared pole for use with the top pole 108.

Referring to FIG. 5, a GMR stack 130 is shown that includes a ferromagnetic free layer 132, a tunnel barrier layer 134, a pinned layer 136, and an antiferromagnetic layer 138. A magnetization of the pinned layer 136 is fixed in a predetermined direction, generally normal to an air bearing surface 140 of the stack 130, while a magnetization of the free layer 132 rotates freely in response to an external magnetic field. The magnetization of the pinned layer 136 is pinned by exchange coupling pinned layer 136 with the antiferromagnetic layer 138. The resistance of the GMR stack 130 varies as a function of an angle formed between the magnetization of the pinned layer 136 and the magnetization of the free layer 132. The magnetization of the pinned layer 136 remains fixed in one direction, while the magnetization of the free layer 132 rotates in response to a fluctuating magnetic field emanating from the spinning magnetic media in the disc drive system. The angle formed between the magnetization of the free layer 132 and the magnetization of the pinned layer 136 changes in response to the fluctuating magnetic field emanating from the magnetic media, so the resistance of the GMR stack 130 also changes in response to this fluctuating magnetic field.

SUMMARY

For ultra-high density recording applications, the recording head should provide sufficient signal (amplitude) for system performance. However, magnetic media track density (tracks per inch, or TPI) has historically increased more than 100% per year, and current physical line widths are approximately 0.1 µm for 100 GB recording heads with a track density of 150 KTPI, and would be expected to be approximately 0.05 µm for 200 GB recording heads, with linear bit density (bits per inch, or BPI) of about 700 KBPI. Tunneling GMR heads provide excellent performance in ultra-high density recording applications, but, as media track density and linear bit density increase, a corresponding increase in recording head sensitivity is required.

The invention provides a current perpendicular to plane (CPP) tunneling magnetoresistive (TMR) recording head in which the ferromagnetic free layer is replaced with a synthetic magnetic material, preferably a synthetic antiferromagnet (SAF) free layer with self demagnetizing anti-parallel magnetic moments.

In one embodiment, the invention is a magnetic sensor including a tunneling magnetoresistive stack. The stack includes a free layer of a synthetic antiferromagnet (SAF).

In another embodiment, the invention is a magnetic read/write head including a tunneling magnetoresistive stack capable of operating in a mode wherein a sense current is applied to the stack in a direction normal to a plane of the stack. The head includes the following layers, in order:

(a) a bias layer of an antiferromagnetic material,
(b) a free layer of a synthetic antiferromagnet (SAF), wherein the SAF includes a first ferromagnetic layer, a second ferromagnetic layer, and a spacer layer between the first and second ferromagnetic layers, wherein the first and second ferromagnetic layers have anti-parallel magnetic moments,
(c) a barrier layer;
(d) a pinned layer of an antiferromagnetic material; and
(e) a pinning layer of an antiferromagnetic material.

In yet another embodiment, the invention is a method for increasing the sensitivity of a magnetic read/write head. The read/write head includes a tunneling magnetoresistive stack capable of operating in a mode wherein a sense current is applied to the stack in a direction normal to a plane of the stack. The method includes incorporating into the stack a free layer of a synthetic antiferromagnet (SAF), wherein the SAF includes a first ferromagnetic layer, a second ferromagnetic layer, and a spacer layer between the first and second ferromagnetic layers, and wherein the first and second ferromagnetic layers have anti-parallel magnetic moments.

Compared to a conventional ferromagnetic free layer, the self demagnetizing field in the free layer reduces the stiffness of the free layer when the recording head is exposed to the media magnetic field. The use of a self demagnetizing free layer also results in a smaller net magnetic moment due to the anti-parallel alignment in the SAF structure. The SAF free layer also provides more total magnetic material and a closed magnetic structure, which enhances stability and reduces magnetic fluctuation caused by temperature variations.

A SAF free layer in a conventional GMR head causes a shunting effect and a reduction of the GMR effect. However, in CPP TGMR heads the current is perpendicular to the film plane and addition of the metallic layers will not cause a shunting effect. No reduction of the TGMR ratio is observed when the extra layer is added, and recording head sensitivity increases by as much as about 50–100%.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 6B is a cross-sectional view of a CPP type TMR head according to the present invention.

Like reference symbols in the various drawings indicate like elements.

DETAILED DESCRIPTION

Figure 1:
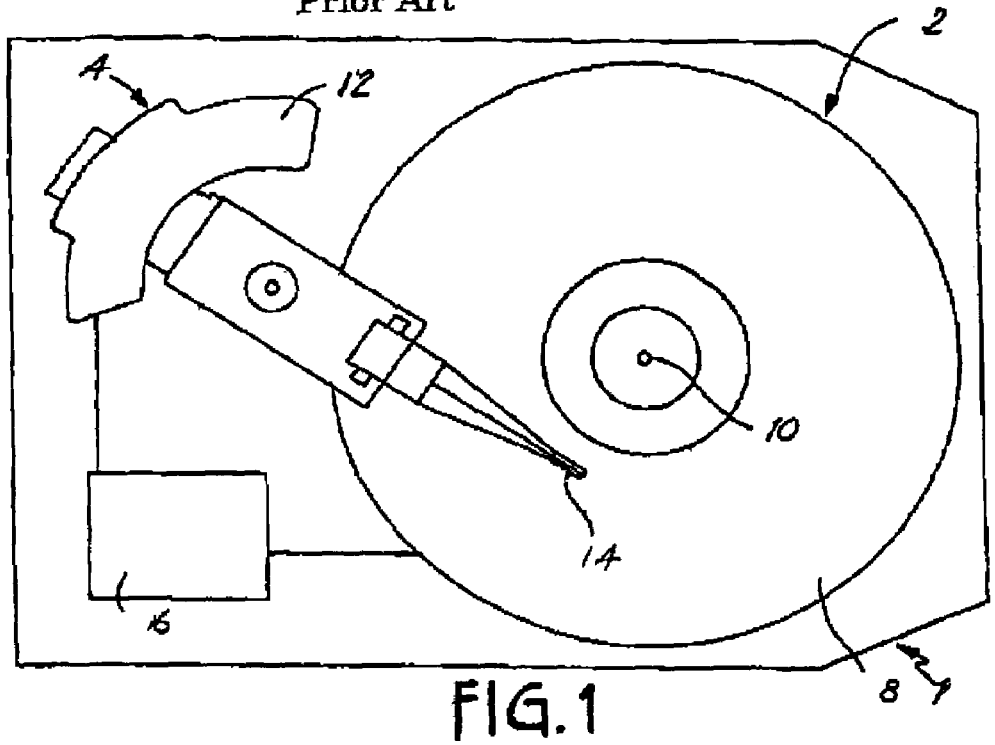
FIG. 1 is a schematic top view of a disc drive system.
Figure 3:
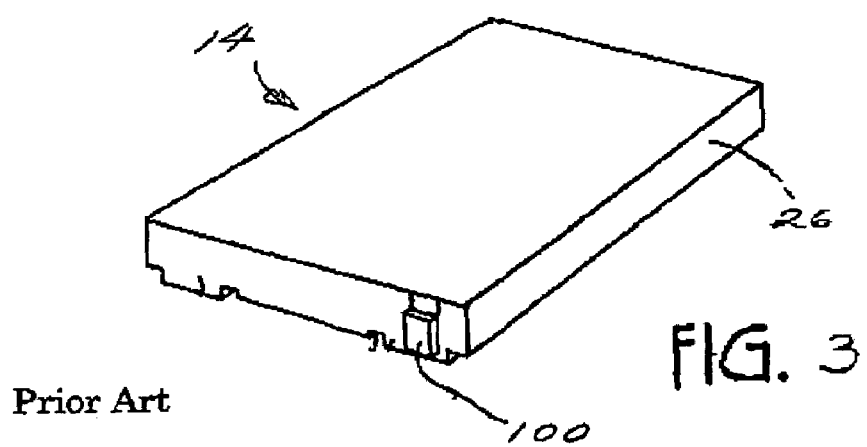
FIG. 3 is a schematic, perspective view of slider with a magnetoresistive sensor.
Figure 2:
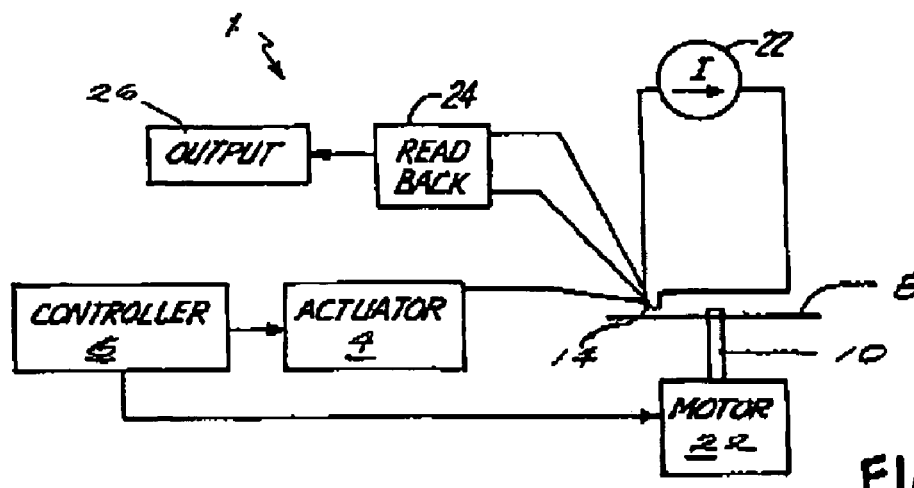
FIG. 2 is a simplified diagram of a magnetoresistive sensor for use in the disc drive system of FIG. 1.
Figure 4:
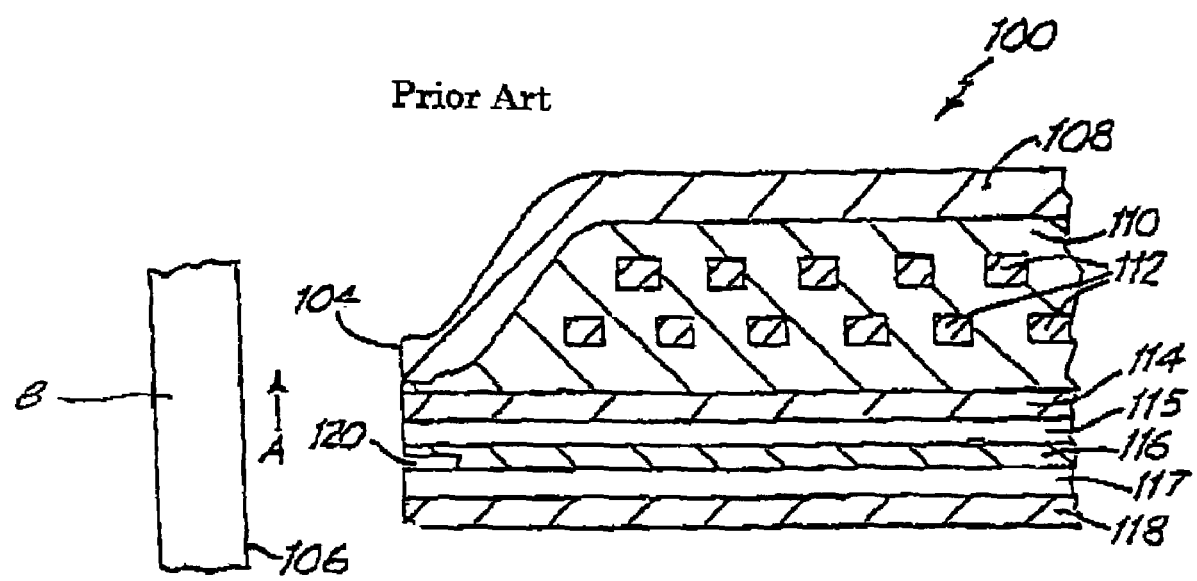
FIG. 4 is a cross-sectional view of a magnetic read/write head and magnetic disc taken along a plane normal to an air bearing surface of the read/write head.
Figure 5:
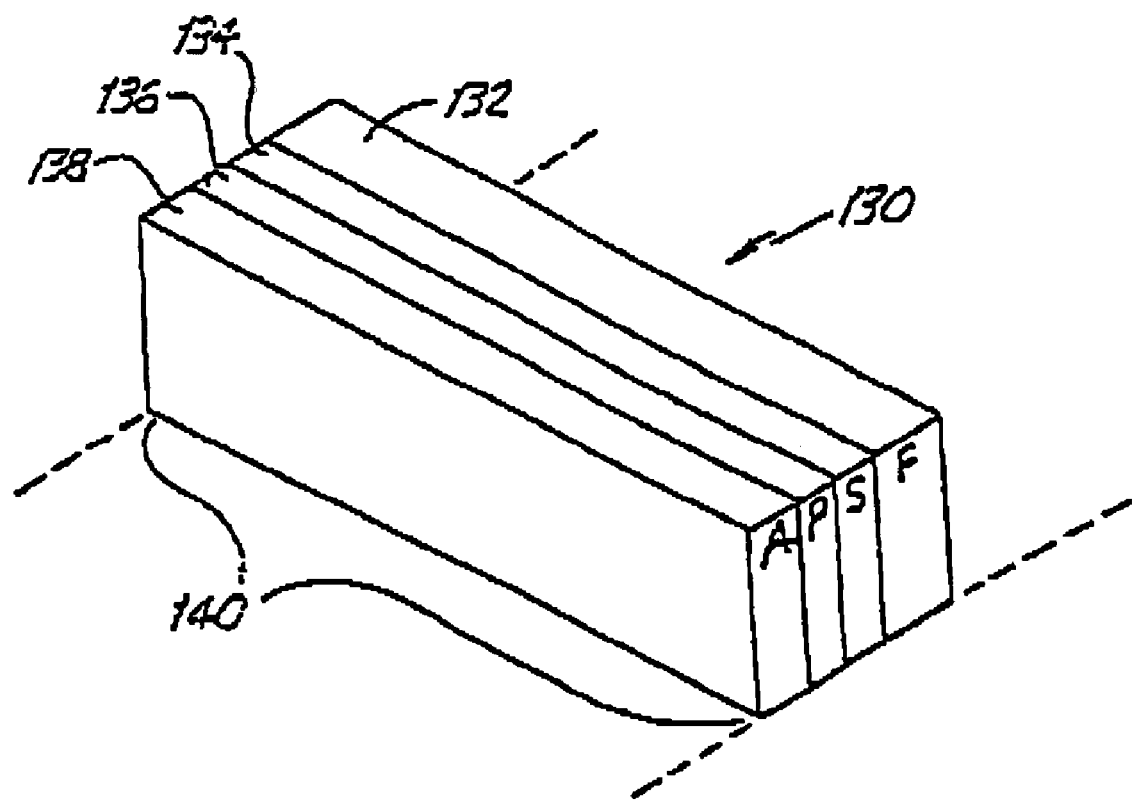
FIG. 5 is a perspective view of a GMR stack.
Figure 6A:
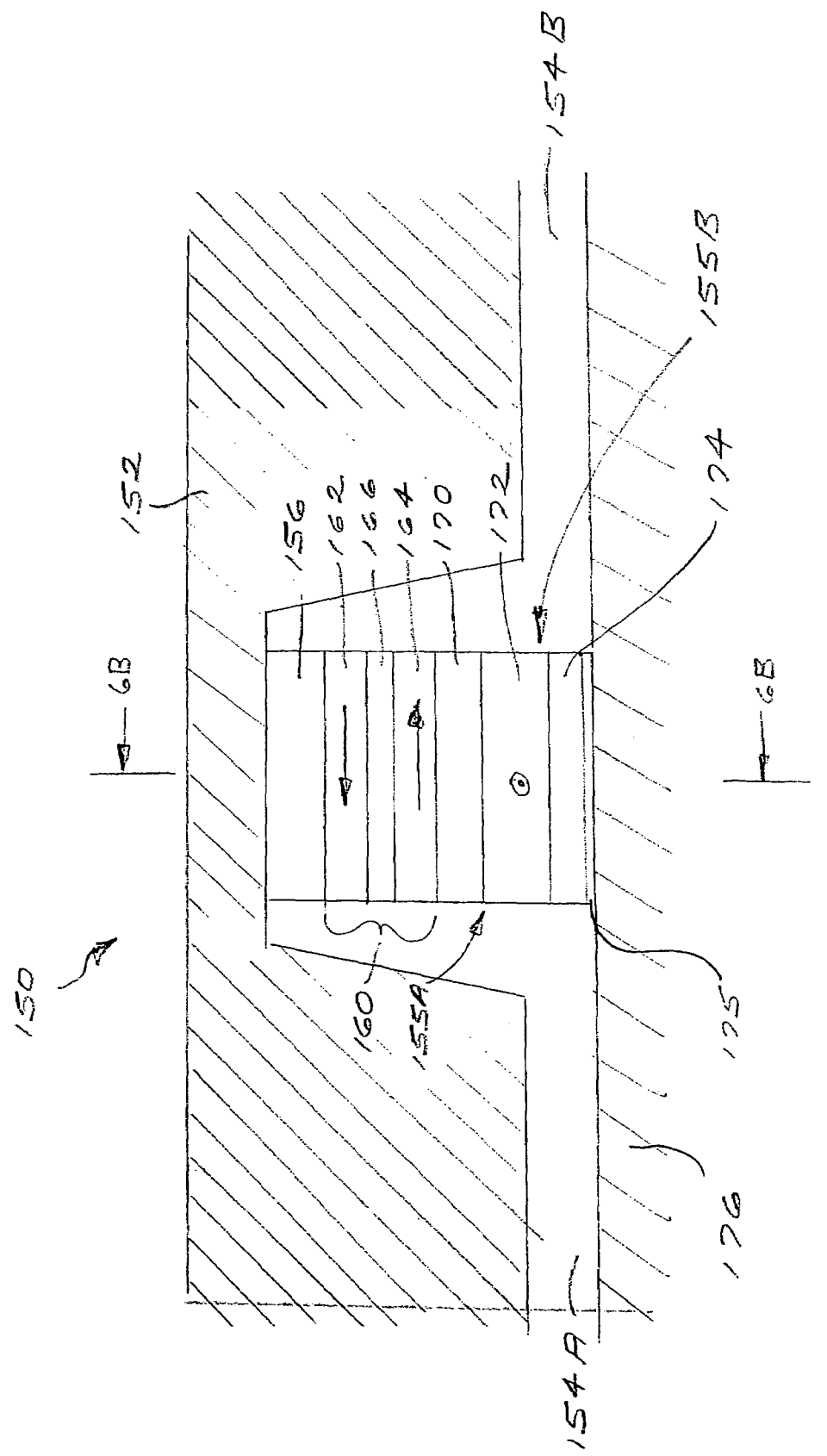
FIG. 6A is an air bearing surface view of a CPP type TMR head according to the present invention.

Referring to FIG. 6A, an air bearing surface (ABS) view of a CPP type TMR recording head 150 is shown that includes a top shield 152, insulation layers 154A and 154B, a free layer bias layer 156, a free layer 160, a barrier layer 170, a pinned layer 172, a pinning layer 174, an optional seed layer 175, and a bottom shield 176.

The insulation layers 154A and 154B are preferably alumina or $SiO_2$.

The free layer bias layer 156 stabilizes and adjusts the sensitivity of the free layer 160. The bias layer 156 is preferably an antiferromagnetic material with a high blocking temperature. Suitable examples of antiferromagntic materials include IrMn, PtMn, NiMn, RhMn, RuRhMn, and the like, and IrMn and RhMn are preferred.

The free layer 160 is a synthetic magnetic material, and a synthetic antiferromagnet (SAF) is preferred. More preferably, the SAF includes a first ferromagnetic layer 162, a second ferromagnetic layer 164, and a spacer layer 166 between the ferromagnetic layers 162, 164. When the two ferromagnetic layers 162, 164, are separated by a spacer layer of an appropriate thickness, the two ferromagnetic layers couple strongly with their magnetic moments antiparallel. The magnetization of the layers 162, 164 in the free layer 160 are shown by the arrows on the respective layers. The ferromagnetic layers 162, 164 have a thickness $T_1$, $T_2$, respectively. The thicknesses $T_1$, $T_2$ may varied as necessary to control the efficiency of the head 150.

The materials used for the ferromagnetic layers 162, 164 may vary widely, but soft ferromagnetic materials such as CoFe have been found to be suitable. For the spacer layer 166, Rh, Cu, Cr and Ru are suitable, and Ru is preferred. For example, if Ru is selected as the material for the spacer layer 166, the spacer layer 166 should preferably have a thickness of about 6 Å to about 9 Å. The free layer 160 may also be further stabilized by an optional conventional ferromagnetic layer such as, for example, a layer of NiFe (not shown in FIG. 6A).

The barrier layer 170 is made of a non-magnetic material, and suitable examples include $Al_2O_3$, $Y_2O_3$, $CeO_2$, TaO, SiN, AlN, HfO and $CrO_2$. A barrier layer 170 of $Al_2O_3$ or HfO is preferred.

The material selected for the pinned layer 172 may vary widely. For example, a soft ferromagnetic material, such as CoFe, with a magnetization out of the paper as represented by the circled dot on the layer 172, may be used. Preferably, the pinned layer 172 is made of a synthetic magnetic material, and an SAF structure (not shown in FIG. 6A) is particularly preferred. As noted above in the discussion of the free layer, SAF structures typically include a pair of ferromagnetic layers, such as CoFe, separated by a nonmagnetic spacer layer such as Ru, Rh, Cu or Cr. The resulting self-demagnetizing field enhances the magnetic stability of the recording head structure.

The material selected for the pinning layer 174 may also vary widely depending on the intended application, and high blocking temperature antiferromagnetic materials are preferred. Typical examples include manganese alloys such as NiMn, FeMn, IrMn, PtMn, NiMn, RhMn, RuMn, RuRhMn, CrMnPt, and the like.

The optional seed layer 175 provides a transition between the crystal lattice of the substrate and the crystal lattice of the pinning layer 174, so that the deposition of the pinning layer is not disrupted at the interface. Suitable examples of the seed layer include Ta and bilayers of Ta and NiFe.

The concave top shield 152 may act as a shared pole in merged read/write heads, and wraps about the free layer 160, which eliminates the need for permanent magnetic layers adjacent to the edges of the free layer. This structure reduces side reading of the recording head 150 and improves its resolution. The top shield 152 and the bottom shield 176 act as electrodes for conducting a sense current, which flows through the magnetoresistive layers 156–174 and normal to the plane of the barrier layer 170. This direction of sense current flow is referred to as current perpendicular to plane (CPP) mode. The magnetoresistive layers 156–174 include end regions 155A and 155B, which are free of metallic or permanent magnetic layers. This allows the ends of the free layer 160 to be placed close to the top shield 152, which confines the bit flux lateral conduction and reduces the side reading of the recording head 150. The enhanced contact area between the free layer bias layer 156 and the conductive top shield 152 also allows use of antiferromagnetic materials with lower blocking temperatures.

Referring to FIG. 6B, a cross sectional view of TMR head 150 is shown that includes top shield 152 and bottom shield 176. The shields 152, 176 extend farther away from the air bearing surface 140 than layers 156–174, and couple magnetoresistive layers 156–174 to the sense current. The self demagnetization of the free layer 160 is shown by the antiparallel magnetization alignment of the ferromagnetic layer 162 (out of the paper) and the ferromagnetic layer 164 (into the paper).

Figure 7:
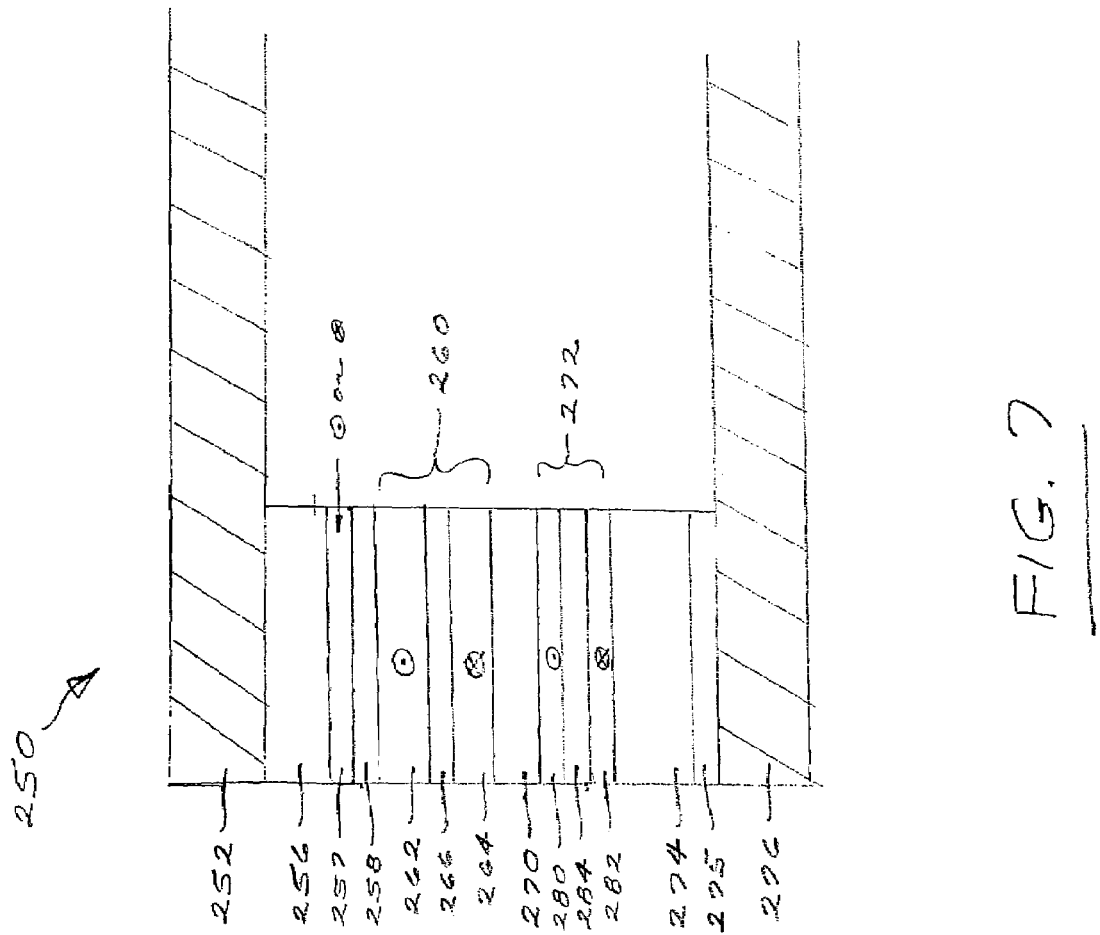
FIG. 7 is a cross-sectional view of a CPP type TMR head according to the present invention.

Referring to FIG. 7, an alternative embodiment of a TMR recording head 250 is shown that includes an optional ferromagnetic and/or spacer layers to assist in the control and/or stabilization of the free layer. In this embodiment, the head 250 includes a top shield 252, a free layer bias layer 256, a ferromagnetic layer 257, a spacer/control layer 258, a free layer 260 with ferromagnetic layers 262, 264 and a spacer layer 266, a barrier layer 270, a pinned layer 272, a pinning layer 274, an optional seed layer 275, and a bottom shield 276.

The free layer bias layer 256 stabilizes and adjusts the sensitivity of the free layer 260, and is preferably an antiferromagnetic material with a high blocking temperature. As in the embodiment shown in FIG. 6, IrMn and RhMn are preferred materials for use in the bias layer 256.

The materials used for the ferromagnetic layer 257 may vary widely, but soft ferromagnetic materials such as CoFe and NiFe have been found to be suitable. The magnetization of the ferromagnetic layer 257 may be parallel or antiparallel to that of the adjacent ferromagnetic layer 262 in the free layer 260.

The spacer/control layer 258 is preferably made of Cu or Ru, although other materials such as Au, Ag, NiFeCr, and Al may also be used. If the magnetization of the ferromagnetic layer 257 is parallel to that of the ferromagnetic layer 262, the thickness of the spacer/control layer 258 should preferably be about 12 Å to about 20 Å. If the magnetization of the ferromagnetic layer 257 is antiparallel to that of the ferromagnetic layer 262, the thickness of the spacer/control layer 258 should preferably be about 7 Å to about 10 Å.

The free layer 260 is a synthetic magnetic material, and a synthetic antiferromagnet (SAF) is preferred. The SAF includes a first ferromagnetic layer 262, a second ferromagnetic layer 264, and a spacer layer 266. Soft ferromagnetic materials such as CoFe have been found to be suitable for the ferromagnetic layers 262, 264, and Ru is preferred for the spacer layer 266. The free layer 260 may also be further stabilized by an optional conventional ferromagnetic layer such as, for example, a layer of NiFe (not shown in FIG. 7).

The barrier layer 270 is made of a non-magnetic material, and suitable examples include $Al_2O_3$, $Y_2O_3$, $CeO_2$, TaO, SiN, AlN, HfO and $CrO_2$. A barrier layer 270 of $Al_2O_3$ or HfO is preferred.

The material selected for the pinned layer 272 may vary widely, and a soft ferromagnetic material, such as CoFe may be used (See, for example, the embodiment shown in FIG. 6). In the embodiment of FIG. 7, the pinned layer 172 is made of a synthetic magnetic material. The synthetic magnetic material is typically an SAF layer with a first ferromagnetic layer 280, a second ferromagnetic layer 282, and a spacer layer 284. As noted above in the discussion of the free layer, the ferromagnetic layers may be CoFe, separated by a nonmagnetic spacer layer such as Ru, Rh, Cu or Cr. The resulting self-demagnetizing field enhances the magnetic stability of the recording head structure.

The material selected for the pinning layer 274 may also vary widely depending on the intended application, and high blocking temperature antiferromagnetic materials are preferred. Typical examples include manganese alloys such as NiMn, FeMn, IrMn, PtMn, NiMn, RhMn, RuMn, RuRhMn, CrMnPt, and the like.

The optional seed layer 275 provides a transition between the crystal lattice of the substrate and the crystal lattice of the pinning layer 274, so that the deposition of the pinning layer is not disrupted at the interface. Suitable materials for the seed layer include Ta and bilayers of Ta and NiFe.

The sensors described above are produced using well known vacuum sputter deposition techniques such as those described in U.S. Pat. No. 6,134,090, which is incorporated herein by reference.

The magnetic sensors described above may be used in a wide variety of applications, including, for example, magnetic recording devices, computers, networks and the like.

A number of embodiments of the invention have been described. Nevertheless, it will be understood that various modifications may be made without departing from the spirit and scope of the invention. For example, the tunneling magnetoresistive sensor may be either a top or bottom tunneling structure, and the either the top shield or the bottom shield may wrap around the magnetoresistive stack. Depending on the intended application, the contact lead layout may also be altered to reduce lead resistance. Accordingly, other embodiments are within the scope of the following claims.

What is claimed is:

1. A magnetic sensor comprising a tunneling magnetoresistive stack, wherein the stack comprises:
   a free layer comprising a synthetic antiferromagnet (SAF);
   a single pinned layer; and
   a bias layer.

2. The sensor of claim 1, wherein the SAF comprises a first ferromagnetic layer, a second ferromagnetic layer, and a spacer layer between the first and second ferromagnetic layers, wherein the first and second ferromagnetic layers have anti-parallel magnetic moments.

3. The sensor of claim 2, wherein the first and second ferromagnetic layers comprise a ferromagnetic material selected from the group consisting of CoFe and NiFe, and the spacer layer comprises a material selected from the group consisting of Ru, Rh, Cr and Cu.

4. The sensor of claim 2, wherein the first and second ferromagnetic layers comprise NiFe, and the spacer layer comprises a material selected from the group consisting of Rh, Cr and Cu.

5. The sensor of claim 2, wherein the first and second ferromagnetic layers comprise NiFe, and the spacer layer comprises a material selected from the group consisting of Ru, Rh, Cr and Cu.

6. The sensor of claim 1, wherein the magnetoresistive stack further comprises a barrier layer on the free layer and a pinned layer on the barrier layer, and wherein the pinned layer comprises a synthetic antiferromagnet (SAF).

7. The sensor of claim 6, wherein the bias layer is disposed on the free layer opposite the barrier layer, wherein the bias layer comprises an antiferromagnetic material.

8. The sensor of claim 7, wherein the antiferromagnetic material is selected from the group consisting of IrMn, PtMn, NiMn, RhMn, and RuRhMn.

9. The sensor of claim 7, further comprising a second spacer layer and a ferromagnetic layer between the bias layer and the free layer.

10. The sensor of claim 9, wherein the spacer layer is made from a material selected from the group consisting of Cu and Ru.

11. The sensor of claim 1, wherein the SAF layer comprises a first ferromagnetic layer, a second ferromagnetic layer, and a spacer layer between the first and second ferromagnetic layers, wherein the first and second ferromagnetic layers are CoFe and have anti-parallel magnetic moments.

12. A magnetic read/write head comprising a tunneling magnetoresistive stack capable of operating in a mode wherein a sense current is applied to the stack in a direction normal to a plane of the stack, wherein the head comprises the following layers, in order:

(a) a bias layer comprising an antiferromagnetic material;
(b) a free layer comprising a synthetic antiferromagnet (SAF), wherein the SAF comprises a first ferromagnetic layer of CoFe, a second ferromagnetic layer of CoFe, and a spacer layer between the first and second ferromagnetic layers, wherein the first and second ferromagnetic layers have anti-parallel magnetic moments;
(c) a barrier layer;
(d) a pinned layer comprising a ferromagnetic layer; and
(e) a pinning layer comprising an antiferromagnetic material.

13. The read/write head of claim 12, wherein the pinned layer is a synthetic antiferromagnet (SAF).

14. The read/write head of claim 12, wherein the first ferromagnetic layer has a thickness T1, the second ferromagnetic layer has a thickness T2, and T1 is not equal to T2.

15. The read/write head of claim 12, further comprising a second spacer layer and a ferromagnetic layer between the bias layer and the free layer.

16. The read/write head of claim 12, wherein the spacer layer comprises a material selected from the group consisting of Ru, Rh, Cr and Cu.

17. The read/write head of claim 16, wherein the spacer layer is Ru.

18. A hard disc drive comprising a magnetic read/Write head of claim 12.

19. A computer comprising the read/write head of claim 12.

20. A magnetic storage device comprising the read/write head of claim 12.

* * * * *